United States Patent
Kakutani et al.

(10) Patent No.: US 7,306,132 B2
(45) Date of Patent: Dec. 11, 2007

(54) BONDING APPARATUS

(75) Inventors: Osamu Kakutani, Oume (JP); Yutaka Kondo, Tachikawa (JP); Yoshihiko Seino, Musashimurayama (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 104 days.

(21) Appl. No.: 11/089,262

(22) Filed: Mar. 24, 2005

(65) Prior Publication Data

US 2005/0211746 A1    Sep. 29, 2005

(30) Foreign Application Priority Data

Mar. 26, 2004 (JP) ............... 2004-092176

(51) Int. Cl.
*H01L 21/60* (2006.01)
(52) U.S. Cl. .................. 228/180.5; 228/110.1; 228/49.5
(58) Field of Classification Search ............ 228/180.5, 228/110.1, 1.1, 49.5
See application file for complete search history.

(56) References Cited

U.S. PATENT DOCUMENTS

| | | | | |
|---|---|---|---|---|
| 3,328,875 A | * | 7/1967 | Pennings | 228/111 |
| 6,176,414 B1 | * | 1/2001 | Sadler | 228/1.1 |
| 6,923,361 B2 | * | 8/2005 | Maeda | 228/1.1 |
| 2003/0076661 A1 | * | 4/2003 | Murata et al. | 361/760 |
| 2005/0109815 A1 | * | 5/2005 | Kakutani | 228/9 |

FOREIGN PATENT DOCUMENTS

| | | |
|---|---|---|
| JP | 2001-168135 | 6/2001 |
| JP | 2003-297872 | 10/2003 |

OTHER PUBLICATIONS

Ryuichi et al., Translation to JP 2003-297872, Oct. 2003, 5 pages.*

* cited by examiner

*Primary Examiner*—Len Tran
(74) *Attorney, Agent, or Firm*—William L. Androlia; H. Henry Koda

(57) ABSTRACT

A bonding apparatus including a front link whose lower end is rotatably connected to a bonding arm and upper portion is rotatably connected to bonding head, and a rear link whose lower end is rotatably connected to the rear end of the bonding arm and upper portion is rotatably connected to the bonding head; and a hypothetical rotational center of capillary of the bonding arm is on a bonding surface and set to be the intersection of a line that connects upper and lower rotational centers of the front link and a line that connects upper and lower rotational centers of the rear link, wherein the immovable element of motor is fastened to the bonding head, and the rotational element of the motor is attached to the upper end of the rear link so that the rotational element rotates about the upper rotational center of the rear link.

5 Claims, 3 Drawing Sheets

BONDING APPARATUS

BACKGROUND OF THE INVENTION

1. Technical Field

The present invention relates to an overhead suspension type bonding apparatus in which the bonding head is suspended from an overhead part.

2. Description of the Related Art

An overhead suspension type bonding apparatus has several characterizing features. Namely, since the bonding head is suspended from an overhead part, a workpiece that has a wide bonding area can be bonded. For instance, Japanese Patent Application Laid-Open (Kokai) Nos. 2001-168135 and 2003-297872 disclose bonding apparatuses of this type.

The bonding apparatus of the above-described prior art type has a structure that includes: a bonding arm which has a capillary, a front arm on which the bonding arm is supported by a supporting shaft so that the bonding arm is rotatable and whose upper portion is attached to a bonding head so that the front arm is swingable, a back arm whose front side is supported on the bonding head so that the back arm is rotatable and whose back side is supported on the bonding arm by a connecting shaft so that the back arm is likewise rotatable, and a driving motor that drives the bonding arm. In this structure, the upper surface of the bonding head is fastened to an XY table that is driven in the directions of the X and Y axes, and this XY table is fastened to the overhead part of a bridge stand of the bonding apparatus.

In the above structure, the driving motor is mounted on the bonding arm, and the center of gravity of the movable elements such as the bonding arm and the like is provided above the horizontal plane of the tip end of the capillary. Accordingly, in cases where the XY table is moved at a high speed in the direction of Y axis (i.e., in the axial center direction of the bonding arm), an inertial force acts on the bonding arm which is a movable element, so that a phenomenon occurs in which this bonding arm also moves at the same time, thus forming a bottleneck in the high-speed movement of the bonding head. There is another problem. When the bonding arm is driven by the driving motor, the bonding arm as a whole vibrates by the reaction force of the motor, so that stable bonding cannot be performed.

BRIEF SUMMARY OF THE INVENTION

The object of the present invention is to provide a bonding apparatus that eliminates the inertial force of the bonding arm and the reaction force of the driving motor, thus making it possible to realize high-speed, highly stable bonding.

The above object is accomplished by a unique structure for a bonding apparatus that includes: a bonding arm which has a capillary at one end thereof, a front link with a lower end portion thereof rotatably connected on the bonding arm and an upper portion thereof rotatably connected on a bonding head, a rear link with a lower end portion rotatably connected on a rear end portion of the bonding arm and an upper portion rotatably connected on the bonding head, and a driving motor which drives the capillary upward and downward; and in this structure, the hypothetical center of rotation of the capillary is located on a bonding surface and is set to be at a point of intersection between an extension of a line that connects the upper and lower centers of rotation of the front link and an extension of a line that connects the upper and lower centers of rotation of the rear link, and an immovable element of the driving motor is fastened to the bonding head, and a rotational element of the driving motor is attached to an upper end portion of the rear link, so that the rotational element is rotatable about an upper center of rotation of the rear link.

In the above-described structure of the bonding apparatus of the present invention, the driving motor has a circular arc shape.

Accordingly, when the bonding head is moved at a high speed in the direction of Y axis, the rear link to which the rotational element of the driving motor is attached generates an inertial force that acts in the direction (by countermovement) which is opposite from the direction of moving of the bonding head. However, since the rear link is attached to the rotational element of the driving motor, the bonding arm (which is a movable element) and the front link generate an inertial force that cancels the inertial force of the rear link. This inertial force cancels the inertial force of the rear link about the hypothetical center of rotation. Accordingly, even if the bonding arm is moved at a high speed, no vibration occurs in the bonding arm. The same is true when the capillary is lowered at a high speed.

DETAILED DESCRIPTION OF THE INVENTION

Figure 1A:
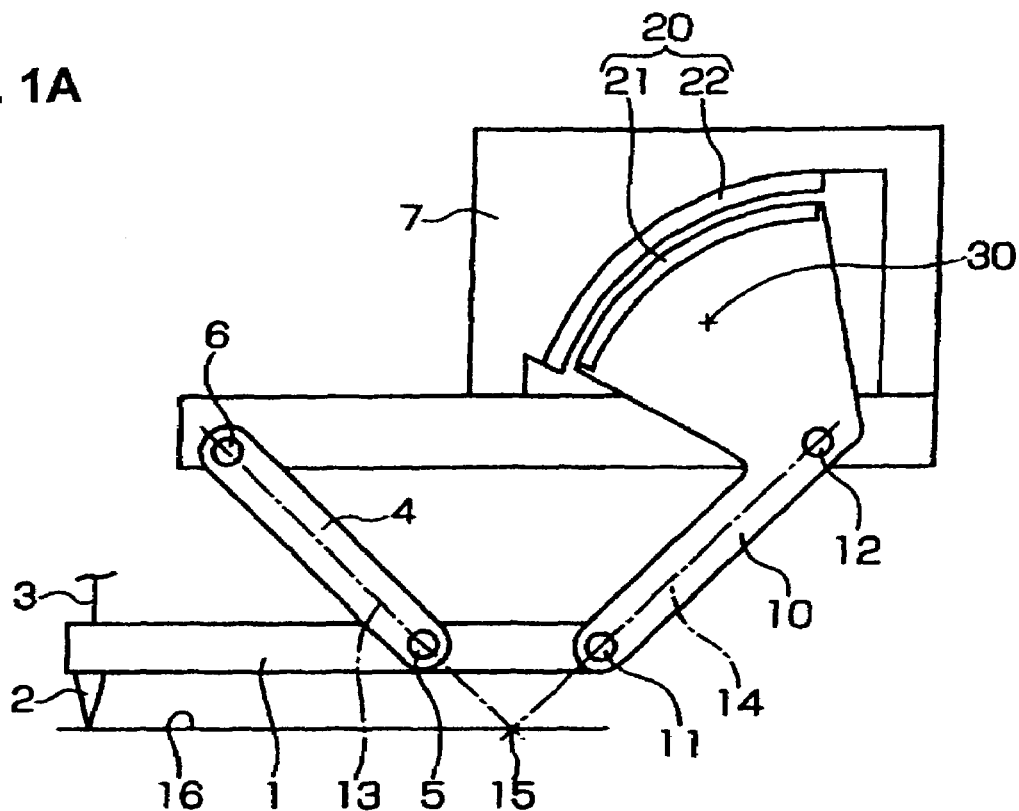
FIGS. 1A and 1B show the basic constructions of the bonding apparatus according to the present invention.

The basic operating principle of the overhead suspension type bonding apparatus according to the present invention will be described with reference to FIGS. 1A and 1B.

A capillary 2 is attached to the end portion of the bonding arm 1, and a wire 3 that is wound on a wire spool (not shown in the drawings) passes through the capillary 2.

A front link 4 is connected to the bonding arm 1 via a supporting shaft 5 so that the lower end portion of a this front link 4 is free to rotate, and the upper end portion of this front link 4 is connected to a bonding head 7 via a supporting shaft 6 so that the upper end portion is free to rotate. Although not shown, the upper surface of the bonding head 7 is fastened to an XY table that is driven in the directions of the X and Y axes, and the XY table is fastened to the overhead part of the bridge stand of the bonding apparatus.

A rear link 10 is connected to the rear end portion of the bonding arm 1 via a supporting shaft 11 so that the lower end portion of the rear link 10 is free to rotate, and the upper portion of the rear link 10 is connected to the bonding head 7 via a supporting shaft 12 so that the upper portion is free to rotate.

The point of intersection between an extension of a line 13, which connects the center of the supporting shaft 6 and the center of the supporting shaft 5, and an extension of a line 14, which connects the center of the supporting shaft 12 and the center of the supporting shaft 11, is set to be the hypothetical center of rotation 15. This hypothetical center of rotation 15 is positioned on the bonding surface 16 and is arranged so that the central axis of the capillary 2 is perpendicular when the capillary 2 contacts the bonding surface 16.

Figure 1B:
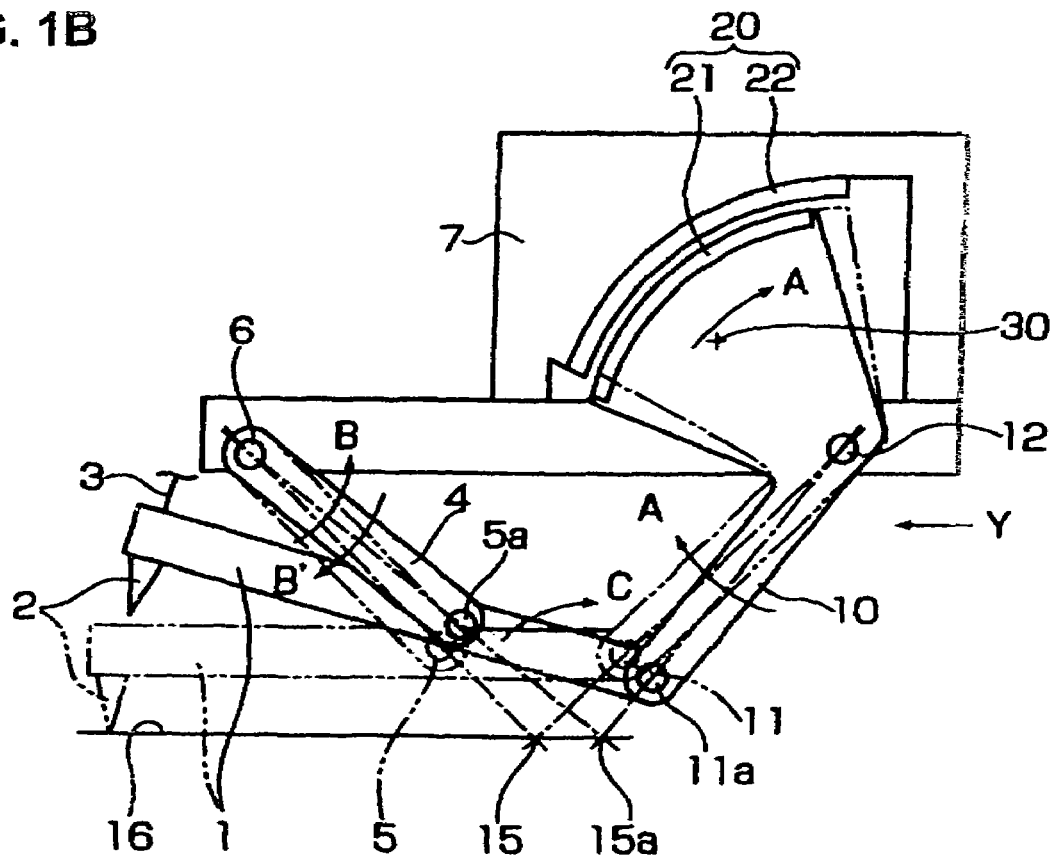

The positions of the supporting shafts 5 and 11 in the state in which the capillary 2 is shown by two-dot chain lines in FIG. 1B are in the positions of the supporting shafts 5*a* and 11*a* in the state in which the capillary 2 has been raised as shown by solid lines. In this case, the hypothetical center of rotation 15 is located at a point shown by the reference number 15*a*.

The magnet 21 of a circular arc form driving motor 20 is attached to the upper end portion of the rear link 10, and the coil 22 of the driving motor 20 is fastened to the bonding head 7.

As will be described later, when the rear link 10 on which the magnet 21 is installed rotates in the direction shown by arrow A, the capillary 2 is lowered. Accordingly, if the position of the center of gravity 30 of the rear link 10 on which the magnet 21 is installed is above the supporting shaft 12 and located in a position that is away from the bonding arm 1 about this supporting shaft 12, then there is a danger that the capillary 2 will drop so that the capillary 2 or a device on which bonding is performed would be damaged when the power supply of the driving motor 20 is cut off. In the shown structure, the position of the center of gravity 30 of the rear link 10 on which the magnet 21 is installed is set to be above the supporting shaft 12 and on the bonding arm 1 side about the supporting shaft 12 (or on the left side of supporting shaft 12 in FIGS. 1A and 2B). More specifically, the driving motor 20 is provide above the supporting shaft 12 and closer to the bonding arm 1 than the driving shaft 12, thus the positional drop of the capillary 2 that would occur when the power supply of the driving motor 20 is cut off is prevented.

Next, the operation will be described with reference to FIG. 1B.

When the bonding head 7 is moved at a high speed in the direction of Y axis (or in the axial center direction of the bonding arm 1), e.g., in the direction shown by arrow Y, in the state the capillary 2 is raised as shown by solid lines in FIG. 1B, the rear link 10 to which the magnet 21, which is a rotational element, of the driving motor 20 is attached generates an inertial force that acts in the direction shown by arrow A (as a result of counter-movement). However, since the rear link 10 is attached to the magnet 21, which is a rotational element, of the driving motor 20, the bonding arm 1 (which is a movable element) and the front link 4 generate an inertial force (in the direction shown by arrow B) that cancels the inertial force of the rear link 10 in the direction shown by arrow A. This inertial force is generated in the direction shown by arrow C about the hypothetical center of rotation 15*a* and cancels the above-described inertial force of the rear link 10 in the direction shown by arrow A. Accordingly, even if the bonding arm 1 is moved at a high speed, no vibration occurs in the bonding arm 1.

When a current is supplied to the driving motor 20 to lower the capillary 2 at a high speed from the state shown by solid lines, the rear link 10 rotates about the supporting shaft 12 in the direction shown by arrow A as shown by two-dot chain lines. The reaction force of the driving motor 20 in this case tends to cause vibration of the bonding head 7 as a whole. However, since the rear link 10 is attached to the rotational element of the driving motor 20, the bonding arm 1 (which is a movable element) and the front link 4 generate an inertial force (in the direction shown by arrow B) that cancels the inertial force of the rear link 10 in the direction shown by arrow A as in the case described above. This inertial force is generated in the direction shown by arrow C about the hypothetical center of rotation 15*a* and cancels the above-described inertial force of the rear link 10 in the direction shown by arrow A. Accordingly, even if the bonding arm 1 is moved at a high speed, no vibration occurs in the bonding arm 1.

When the rear link 10 rotates about the supporting shaft 12 in the direction shown by arrow A as shown by two-dot chain lines from the state shown by solid lines as described above in order to lower the capillary 2, the front link 4 rotates about the supporting shaft 6 in the direction shown by arrow B' as shown by two-dot chain lines. The bonding arm 1 swings about the hypothetical center of rotation which is at point 15*a* while the hypothetical center of rotation moves from point 15*a* to point 15, so that the capillary 2 is lowered; and the wire 3 is grounded on the workpiece (not shown in the drawings) which is set on the bonding surface 16, so that boding is accomplished.

Thus, since the coil 22 which is an immovable element of the driving motor 20 is fastened to the bonding head 7, and the magnet 21 which is a rotational element of the driving motor 20 is attached to the upper end portion of the rear link 10 so that this magnet 21 rotates about the upper rotational center 12 of this rear link 10, no vibration occurs in the bonding arm 1 even if the bonding arm 1 is caused to move at a high speed.

Figure 2:
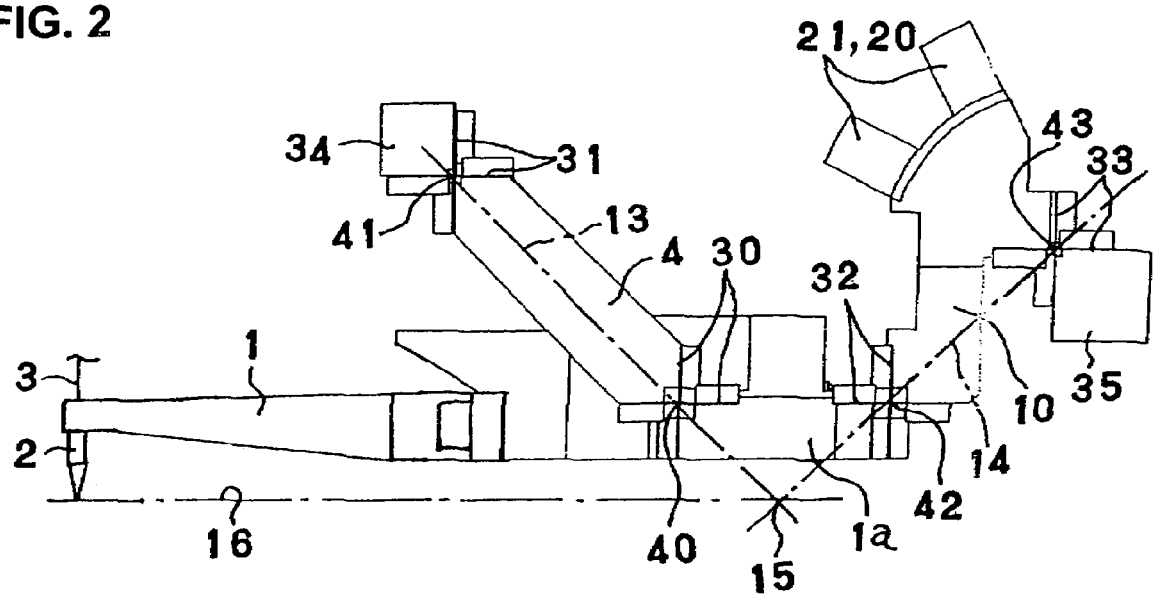
FIG. 2 is a side view of one embodiment of the bonding apparatus according to the present invention, showing its concrete construction.
Figure 3:
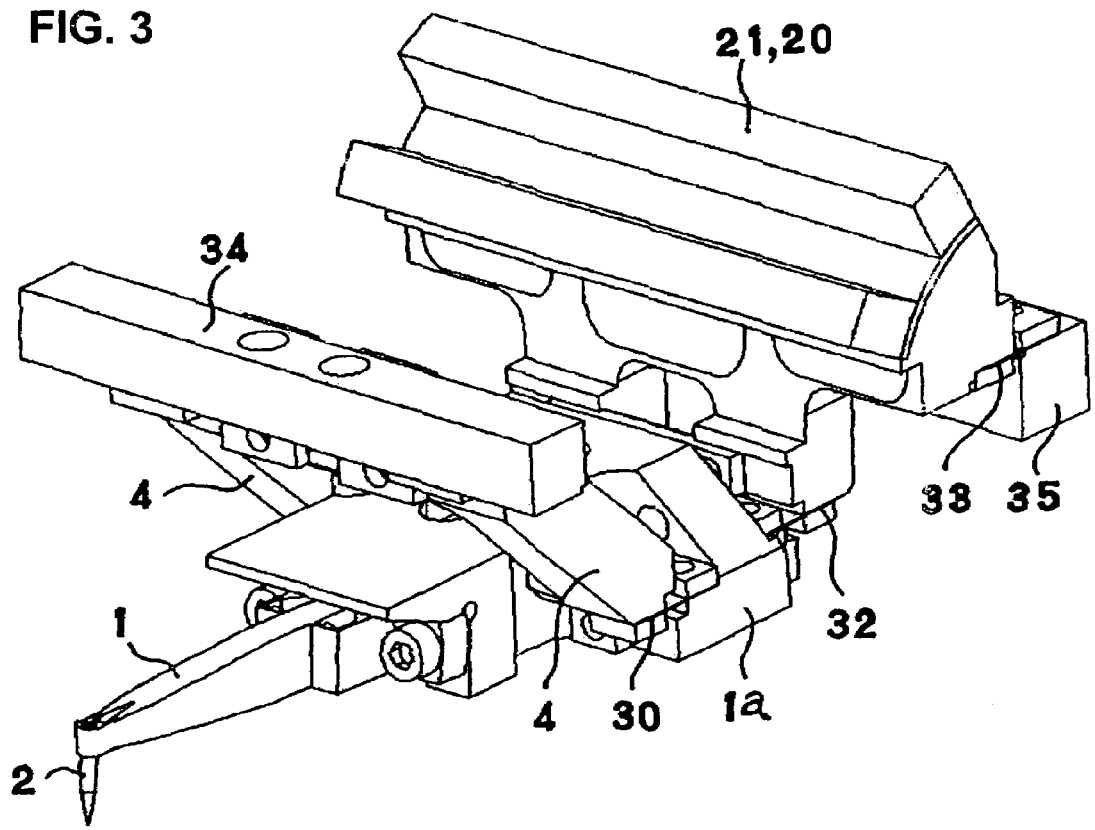
FIG. 3 is a perspective view of FIG. 2 seen from the front.
Figure 4:
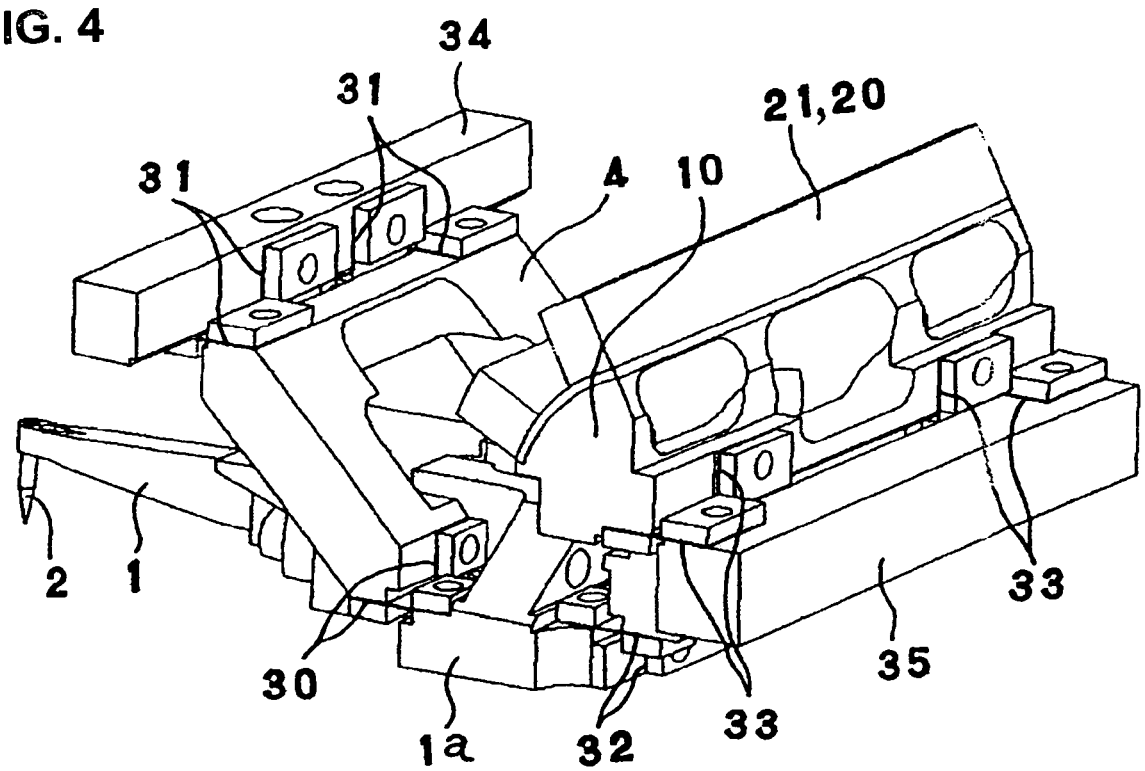
FIG. 4 is a perspective view of FIG. 2 seen from the back.

FIGS. 2 through 4 show, in a concrete manner, an embodiment of the overhead suspension type bonding apparatus of the present invention.

The embodiment shown in FIGS. 2 through 4 uses cruciform plate springs 30, 31, 32 and 33 instead of the supporting shafts 5, 6, 11 and 12 that are described in the above-described principle of the present invention in FIGS. 1A and 1B. Furthermore, respective link attachment members 1*a* are provided on both sides of the back of the bonding arm 1. Moreover, an attachment member 34 to which the cruciform plate spring 31 is attached and an attachment member 35 to which the cruciform plate spring 33 is attached are provided, and these attachment members 34 and 35 are attached to the bonding head 7. The remaining structure is substantially the same as that of the above-described embodiment.

A capillary 2 is attached to the end portion of the bonding arm 1, and a wire 3 wound on a wire spool (not shown in the drawings) passes through the capillary 2. Respective link attachment members 1*a* are disposed on both sides of the back of the bonding arm 1, and both sides of the undersurface of a front link 4 are fastened to the front sides of the link attachment members 1*a* via the cruciform plate spring 30. Both sides of the upper surface of the front link 4 are fastened to the attachment member 34 via the cruciform plate spring 31, and the attachment member 34 is fastened to the bonding head 7. Though not shown, the upper surface of the bonding head 7 is fastened to an XY table that is driven in the directions of the X and Y axes, and this XY table is fastened to the overhead part of the bridge stand of the bonding apparatus.

Both sides of the undersurface of the rear link 10 are fastened to the rear end portions of the link attachment members 1*a* via the cruciform plate spring 32, and both sides of the upper surface of the rear link 10 are fastened to the attachment member 35 via the cruciform plate spring 33. The attachment member 35 is fastened to the bonding head 7. Here, the point of intersection between an extension of a line 13 that connects the supporting point 41 of the cruciform plate spring 31 and the supporting point 40 of the cruciform plate spring 30 and an extension of a line 14 that connects the supporting point 43 of the cruciform plate spring 33 and the supporting point 42 of the cruciform plate spring 32 is set to be the hypothetical center of rotation 15. This hypothetical center of rotation 15 is positioned on the bonding surface 16 and is arranged so that the central axis of the capillary 2 is perpendicular when the capillary 2 contacts the bonding surface 16.

In the structure of the embodiment shown in FIGS. 2 through 4, the supporting shafts 5, 6, 11 and 12 shown in FIGS. 1A and 1B are replaced by cruciform plate springs 30, 31, 32 and 33. Accordingly, the structure shown in FIGS. 2 through 4 has the substantially the same advantages as those of the structure shown in FIGS. 1A and 1B.

The invention claimed is:

1. A bonding apparatus comprising:
   a bonding arm which has a capillary at one end thereof;
   a front link in which a lower end portion thereof is rotatably connected to said bonding arm via supporting shafts and an upper portion thereof is rotatably connected to a bonding head via said supporting shafts;
   a rear link in which a lower end portion thereof is rotatably connected to a rear end portion of said bonding arm via said supporting shafts and an upper portion thereof is rotatably connected to said bonding head via said supporting shafts, and a position of a center of gravity thereof is set above said supporting shafts and is set on said bonding arm side about said supporting shaft of said upper portion thereof; and
   a driving motor which drives said capillary upward and downward;
   a virtual center of rotation of said capillary is located on a bonding surface and is set to be at a point of intersection between an extension of a line that connects upper and lower centers of rotation of said front link and an extension of a line that connects upper and lower centers of rotation of said rear link; and
   said driving motor including a stationary element fastened to said bonding head, and a rotational element of said driving motor attached to an upper end portion of said rear link to drive rotatably about an upper center of rotation of said rear link so as to cancel inertial forces generated from said bonding arm and said front link by operating said bonding apparatus.

2. The bonding apparatus according to claim 1, wherein said driving motor has a circular arc shape.

3. The bonding apparatus according to claim 1, wherein a coil of said driving motor comprises said immovable element, and a magnet of said driving motor comprises said rotational element.

4. The bonding apparatus according to claim 2, wherein a coil of said driving motor comprises said immovable element, and a magnet of said driving motor comprises said rotational element.

5. The bonding apparatus according to claim 1, wherein said supporting shafts have cross plate springs.

* * * * *